United States Patent [19]

Sah et al.

[11] Patent Number: 4,665,277
[45] Date of Patent: May 12, 1987

[54] FLOATING EMITTER SOLAR CELL

[75] Inventors: Chih Sah, Urbana, Ill.; Li-Jen Cheng, La Crescenta, Calif.

[73] Assignee: The United States of America as represented by the Administrator of the National Aeronautics and Space Administration, Washington, D.C.

[21] Appl. No.: 838,648

[22] Filed: Mar. 11, 1986

[51] Int. Cl.[4] .............................................. H01L 31/06
[52] U.S. Cl. ..................... 136/255; 136/249; 357/30; 357/35
[58] Field of Search .......... 136/255, 249 TJ, 249 MS; 357/30, 35

[56] References Cited

U.S. PATENT DOCUMENTS

| | | | |
|---|---|---|---|
| 4,090,213 | 5/1978 | Maserjian et al. | 136/255 |
| 4,131,486 | 12/1978 | Brandhorst, Jr. | 136/255 |
| 4,133,698 | 1/1979 | Chiang et al. | 136/255 |
| 4,232,245 | 11/1980 | Savoye et al. | 313/367 |
| 4,255,211 | 3/1981 | Fraas | 136/249 TJ |
| 4,315,097 | 2/1982 | Solomon | 136/255 |
| 4,316,049 | 2/1982 | Hanak | 136/244 |
| 4,341,918 | 7/1982 | Evans, Jr. et al. | 136/249 MS |
| 4,365,262 | 12/1982 | Nishizawa | 356/31 |
| 4,367,368 | 1/1983 | Wolf | 136/255 |
| 4,385,198 | 5/1983 | Rahilly | 136/249 TJ |
| 4,427,839 | 1/1984 | Hall | 136/255 |

OTHER PUBLICATIONS

G. A. Landis, *Solar Cells*, vol. 3, pp. 91-94 (1981).
M. I. Yernaux et al, *Solar Cells*, vol. 13, pp. 83-97 (1984).
W. T. Matzen, S. Y. Chiang, and B. G. Carbajal, "A Device Model for the Tandem Junction Solar Cell," *IEEE Transactions on Electron Devices*, vol. ED-26, No. 9, pp. 1365-1368, (Sep., 1979).
Shang-Yi Chang, B. G. Carbajal and G. F. Wakefield, "Improved Performance Thin Solar Cells," *IEEE Transactions on Electron Devices*, vol. ED-25, No. 12, pp. 1405-1408, (Dec. 1978).

*Primary Examiner*—Aaron Weisstuch
*Attorney, Agent, or Firm*—Paul F. McCaul; John R. Manning; Thomas H. Jones

[57] ABSTRACT

Front surface contact floating emitter solar cell "transistors" having a semiconductor body (n-type) and floating emitter sections (p-type) diffused or implanted in the front surface are provided with sections diffused or implanted in the front surface between the floating emitter sections, but isolated from the floating emitter sections, for use either as a base contact to the n-type semiconductor body, in which case the section is doped n+, or as a collector for the adjacent emitter sections, in which case the section is doped p+. In the first case, the structure is provided with p+ semiconductor material on the back to serve as a collector, and in the second case with n+ semiconductor material on the back to serve as a base contact. In either case, the semiconductor material on the back may be a starting substrate of suitably doped semiconductor material. In the case of the substrate being the collector, a groove is etched to isolate the collector junctions from saw damage on the edge. Using ion implantation techniques, floating emitter solar cell "transistor" structures may be fabricated in an implanted well (n-type for p-n-p transistors) to obviate the need for a groove.

9 Claims, 10 Drawing Figures

FLOATING EMITTER SOLAR CELL

ORIGIN OF INVENTION

The invention described herein was made in the performance of work under a NASA contract, and is subject to the provisions of Public Law 96-517 (35 USC 202) in which the Contractor has elected not to retain title.

BACKGROUND OF THE INVENTION

This invention relates generally to junction solar cell structures, and more particularly to a floating emitter solar cell.

There is continuing need to improve the conversion efficiency of solar cells. Since about 1956, silicon solar cell conversion efficiency has been improved from about 5% to more than 16%. Improvements both in materials and in processing technologies, resulting in shallower junctions and lower series resistance, has been largely responsible for this improvement. However, a compromise between shallower junctions and lower series resistance of the front diffused region soon reached its limits. Similarly, a compromise between more absorption with thicker cells and more collection at the front junction, which need longer minority carrier diffusion length, has reached its limit.

The quest for higher efficiency has led to multijunction solar cells, such as tandem (stacked) junction solar cells. Because of improvements in techniques of epitaxial silicon growth, with finer control of doping possible, a multilayered structure of two or more p/n junctions can be produced with $n^+/p^+$ tunnel junctions between them acting as low resistance connections. The stack is characterized by a high open circuit voltage that is the sum of the open circuit voltages of the individual cells. The problem is that a large interface recombination velocity ($10^5$ cm/sec) at the tunnel junction of a multijunction silicon solar cell degrades its performance below that of a conventional monojunction silicon solar cell. Consequently, such tandem solar cells affect efficiency of the cells. Improvement is necessary if efficiencies of over 20% (AM1) are to be achieved with high open circuit voltages.

More recent developments have led to floating emitter solar cells. See U.S. Pat. No. 4,133,698 to Shang-Yi Chiang and Bernard G. Carbajal, and a later paper by Matzen, Chiang, and Carbajal titled "A Device Model for the Tandem Junction Solar Cell" published in *IEEE Transactions on Electron Devices*, Vol. ED-26(9) pp. 1365-1368, September 1979; and U.S. Pat. No. 4,341,918 to John C. Evans, An-Ti Chai and Chandra P. Goradia, and a later paper titled "High-Voltage Solar-Cell Chip" by V. J. Kapoor, G. J. Valco, G. G. Skebe and J. C. Evans, Jr. published in the *Journal of Applied Physics*, Vol. 57(4), pp 1343-1346, Feb. 15, 1985. An advantage of a solar cell structure having a floating emitter is that the efficiency of the cell is less sensitive to surface and bulk recombination losses in the front junction emitter layer.

The inventors herein, have conducted minority carrier recombination rate studies and explored the barriers to achieving high efficiency solar cells. They studied a simple vertical floating emitter structure for a solar cell to attain very high efficiency above 20% (AM1). This structure was disclosed in the Progress Report 23 (September 1983 to March 1984) of the Flat-Plate Solar Array Project (J.P.L. Publication 84-47), that was prepared for the U.S. Department of Energy through an Agreement with National Aeronautics and Space Administration by the Jet Propulsion Laboratory, California Institute of Technology. It will be described hereinafter with reference to FIGS. 1a and 1b in conjunction with an equivalent circuit diagram shown in FIG. 2. A two-junction solar cell using the transistor action similar to that disclosed by Evans, et al., in U.S. Pat. No. 4,341,918 will be described.

The earlier U.S. Pat. No. 4,133,698 discloses a two-junction solar cell using transistor action. Although that patent does not seem to recognize the importance of the transistor action, the later paper by Matzen, Chiang, and Carbajal referred to above does recognize it, and gives the correct theory of operation using a simple equivalent circuit.

All of the prior art structures are back surface contact solar cell "transistors" having both base and collector contacts on the back. An object of this invention is to provide a high efficiency floating emitter solar cell "transistor" of a configuration which uses a front surface contact for one of the two contacts required for the base and collector.

Still another object is to provide floating emitter solar cell "transistors" of such a configuration that they may be easily fabricated with standard VLSI techniques.

Yet another object is to provide floating emitter solar cell "transistors" that may be fabricated with a thick substrate layer so that mechanical breakage problems for large (4 to 6 inch diameter) cells are avoided.

SUMMARY OF THE INVENTION

In accordance with the present invention, a front surface contact floating emitter solar cell "transistor" is provided in a semiconductor body (n-type), in which floating emitter sections (p-type) are diffused or implanted in the front surface. Between the emitter sections, a further section is diffused or implanted in the front surface, but isolated from the floating emitter sections, for use either as a base contact to the n-type semiconductor body, in which case the section is doped $n^+$, or as a collector for the adjacent emitter sections, in which case the section is doped $p^+$. In the first case, the structure is diffused or implanted $p^+$ on the back in a section that serves as a collector, and in the second case the structure is diffused or implanted $n^+$ all across the back to serve as a base contact. In either case, $n^+$ or $p^+$ semiconductor material on the back may be provided as a starting substrate, in which case the base layer is n-type epitaxially grown on the substrate, and the collector base contact section is diffused in the epitaxy layer as are the emitter sections. In the case of the substrate $p^+$ being for use as the collector, a groove is etched to isolate the collector p/n junction from saw damage on the edge. Otherwise there is no saw damage across any active junction where a cut is made. The substrate provides greater strength to minimize breakage in handling.

In alternative structures for a vertical floating emitter solar cell "transistor" employing ion implanation instead of diffusion, a well is first implanted in the front to a depth sufficient to form a collector junction with a substrate, and then emitter and base sections are implanted. In one case, the starting material is p-type and a deep $p^+$ layer is implananted leaving a p-type substrate. Then an n-type well is implanted to a depth sufficient to provide an $n/p^+$ junction. In another case, the starting material is $p^+$ and a p- or intrinsic epitaxy layer is grown. Than an n-type well is implanted to a depth sufficient to provide an n/p+ junction. In this case, implantation may be followed by diffusion to increase the depth of the well. In both cases, the structure is completed in the same way by implanting shallow emitter and base sections. A major advantage is that no wafer edge groove is necessary since the floating emitter solar cell transistors are isolated from saw damage, so long as a cut is not made through the well.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1b illustrates the flow path of photogenerated minority carriers (holes) near the n/n+ base contact of one junction cell region of the solar cell of FIG. 1a.

FIG. 2 is a diagram of an equivalent circuit of the floating emitter solar cell "transistor" of FIG. 1a.

FIG. 3 shows schematically a cross section of a variant of the back surface contact vertical floating emitter solar cell "transistor" of FIG. 1a.

FIG. 4b shows schematically a cross section of a variant of the solar cell of FIG. 4a.

FIG. 5 illustrates a variant of the solar cell "transistor" of FIG. 4a.

DETAILED DESCRIPTION OF PREFERRED EMBODIMENTS

Figure 1A:
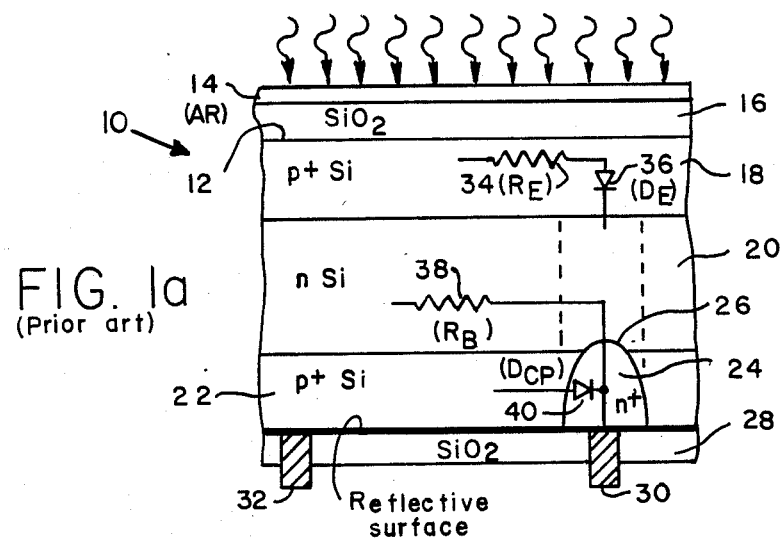
FIG. 1a shows schematically a cross section of a simple structure for a vertical floating emitter solar cell "transistor"

Referring to the drawings, FIG. 1a illustrates a cross-sectional view of a floating emitter solar cell "transistor" (SCT) 10 in the back surface contact (BSC) vertical floating emitter (VFE) configuration. It includes on a front surface 12 an illuminatable antireflection coating 14 over a layer 16 of SiO$_2$, and further includes an emitter layer 18 doped p+, a base layer 20 doped n, a collector layer 22 doped p+, a finger-shaped base contact section 24 (hereinafter "finger") doped n+ which produces a low/high (n/n+) finger shaped junction 26 between the base contact section 24 and the collector 22 and base 20. An SiO$_2$ layer 28, a back surface contact 30 to the finger 24, and a collector contact 32 complete the floating emitter solar cell "transistor".

The p+ emitter layer 18 inherently includes lateral resistance (RE) 34 and an emitter junction diode (D$_E$) 36. The base layer 20 inherently includes lateral resistance (R$_B$) 38 and the collection layer 22 includes a collector perimeter diode (D$_{CP}$) 40. It is assumed that the solar cell "transistor" 10 includes not only a perfect multiple dielectric antireflective coating 14 on the front surface 12, but also a perfect reflecting surface at the interface of the collector layer 22 and SiO$_2$ layer 28. This causes radiation at the front surface 12 to pass through the active p/n junctions twice.

The structure of the BSC-VFE-SCT shown in FIG. 1a is not optimum because the collector perimeter (p+/n+) diode 40 is very troublesome. The edge of that diode near the interface between the base layer 22 and the SiO$_2$ layer 28 would be tunneling since the dopant concentration of the diffused or implanted collector (p+) layer 22 and finger (n+) section 24 would be very high.

Figure 2:
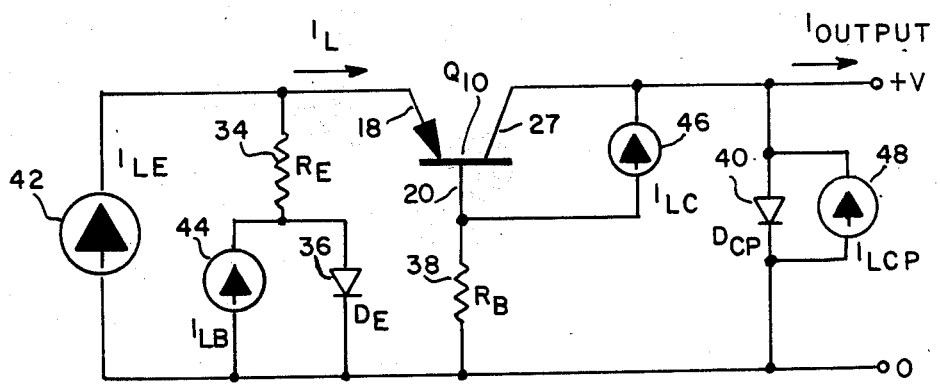

The operation and losses of the BSC-VFE-SCT 10 are best delineated using the equivalent circuit diagram of FIG. 2. This is helpful in analyzing two-dimensional structural effects and obtaining the transistor-diode equations which can be used to optimize the device geometry and material-dopant density variations.

The circuit diagram of FIG. 2 includes a p-n-p junction transistor Q$_{10}$ for the P+/n/p+ junctions, the emitter lateral resistance (R$_E$) 34, the emitter junction diode (D$_E$) 36, the base lateral resistance (R$_B$) 38, the collector perimeter diode (D$_{CP}$) 40 and further includes an emitter photocurrent source (I$_{LE}$) 42 and a base photocurrent source (I$_{LB}$) 44, the sum of which provides the total photocurrent (I$_L$) at the junction between the emitter 18 and base 20, a collector photocurrent source (I$_{LC}$) 46 at the junction of the base 20 and collector 22, and a collector diode photocurrent source (I$_{LCP}$) 48 across the collector perimeter diode (D$_{CP}$) 40.

Figure 1B:
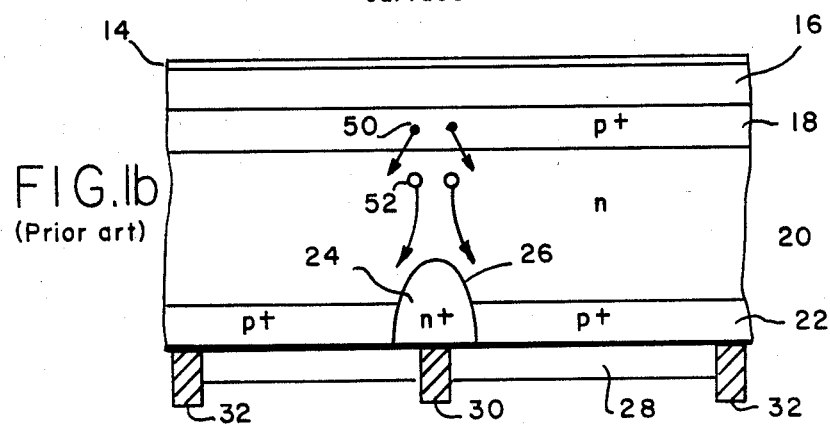

The two sources 42 and 44 differ in that the emitter source (I$_{LE}$) 42 extends across the large front emitter layer 18 of the solar cell transistor 10, while the base source (I$_{LB}$) 44 extends only across the small area of the base contact diode (D$_E$) 36 through the finger 24, as indicated by dashed lines from the area of the finger section 24 to the emitter layer. Since the low/high (n/n+) junction 26 is a reflecting boundary for the photogenerated holes 52 from the front emitter/base junction, as shown in FIG. 1b, and the base/collector junction adjacent to the junction 26 is an infinite sink for the injected holes, most of the photogenerated holes 52 from the diode 36 of the junction between the emitter 18 and base 20 will flow laterally to the (n/p+) junction between the base 20 and collector 22, as shown in FIG. 1b. This enhances the forward alpha or forward common base current gain $\alpha_F$ of the p+/n/p+ floating emitter solar cell transistor 10.

The lateral motion of the holes 52 is not affected much by hole repulsion as has been thought. Instead, the lateral motion of the holes 52 can be easily estimated by the simple geometrical construction using the minority carrier (hole) base diffusion length concept proposed and demonstrated by C. T. Sah, K. A. Yamakawa, and R. Lutwack, "Reduction of solar cell efficiency by edge defects across the back-surface-field junction:-a developed perimeter model," *Solid-State Electronics*, Vol. 25, 851–858, Sept 1, 1982, and C. T. Sah, K. A. Yamakawa, and R. Lutwack, "Reduction of solar cell efficiency by bulk defects across the back-surface-field junction," *Journal of Applied Physics*, Vol. 53(4), 3278–3290, Apr. 1, 1982.

The resistance (R$_E$) 34 is the lateral resistance which connects the two front junction cells, namely the p+n/p+ main cell and the p+/n/n+ basecontact cell. Due to the small base photocurrent I$_{LB}$ flowing in the p+/n/n+ base-contact cell from the small area between the dashed lines and its n/n+ minority carrier reflecting contact, the lateral current $I_{LB}$ is negligibly small compared with the main current $I_{LE}$ of 32 mA/cm$^2$ to 38 mA/cm$^2$. This illustrates the small degradation expected from the sheet resistance of the emitter layer 18 controlled by the level of doping, thus permitting the emitter to be designed for low dopant density. This design permits the heavy doping effects of both emitter bulk and emitter/oxide interface recombination losses to be avoided while still maintaining a high forward alpha to give nearly maximum short-circuit current and a substantial increase in the open-circuit voltage.

The lateral resistance ($R_B$) 38 is the lateral base resistance of the solar cell "transistor" 10. It is the series resistance of the cell. Since the series resistance of the cell must be made low to minimize the series resistance loss, resistance 38 is the most critical parameter in the floating emitter solar cell "transistors" 10. However, the resistance 38 cannot be made too low or else the base dopant concentration will not be sufficiently low to maintain a near unity forward and reverse alpha, or a greater than about 100 forward and reverse beta (common emitter and common collector gains). Thus, a significant engineering compromise must be made in the design of the lateral resistance to obtain the optimum or maximum efficiency due to these to opposing effects.

If a transmission line analysis of the voltage drop along the base lateral resistance ($R_B$) 38 is performed, the voltage drop across a given length of line, Z, is given by $$V(t) - V(0) = R_S(J_L Z^2/2) \qquad (1)$$

where $R_S$ is the sheet resistance per square of the base layer 20, $J_L$ is the collector current density which is nearly equal to the total lateral current $I_L$ flowing in the base layer 20 divided by the total area of the main cell (area outside the dotted lines) and Z is the separation between the two base contacts (fingers) located at Z=0 and Z. For a one centimeter spacing of the base contact fingers 24, the base resistance ($R_B$) 38 must be less than about 1.25 ohms per square to provide a 5 mv drop or less. Thus, spacing of the base contact fingers must be made smaller, on the order of 100 microns to allow for a 125 ohm per square sheet resistance of the base layer 20. This requirement is easily attainable with the state-of-the-art VLSI technology for providing an n+ finger width of one or two microns and a spacing of one-hundred to two-hundred microns between fingers.

The above consideration for the base lateral resistance ($R_B$) 38 also provides an upper bound for the sheet resistance of the floating emitter layer 18 which is limited by the necessity of having a nearunity forward alpha while still having a very thin emitter layer 18 for absorbing most of the ultraviolet let photons. For a 100 ohm per square sheet resistance of the base layer 20 and a fifty micron thick base layer 20, the sheet resistance of a 0.25 micron thick emitter layer 18 would be approximately fifty ohms per square if we assume the mobility of the plurality of photogenerated holes 52 in the higher doped p-type emitter layer 18 to be four times less than the plurality of electrons 50 in the lower doped n-type base layer 20. The low sheet resistance of the emitter layer 18 is necessary to assure a high forward alpha (common base current gain) of 0.99 to 0.995 or to assure a high forward beta (common emitter current gain) of 100 to 200 in order to take advantage of the large increase in the open-circuit voltage that can be derived from the structure of the solar cell "transistor" 10. The sheet resistance of the emitter layer 18 of fifty ohms per square provides an average hole or emitter dopant density of approximately 2.0E19 cm$^{-3}$ ($2.0 \times 10^{19}$ holes/cm$^3$) which is just below the heavy doping range. A more careful and complete analysis can further reduce the dopant concentration of the emitter layer 18.

The collector photocurrent source ($I_{LC}$) 46 is the photocurrent generator across the rear n/p+ junction between the base 20 and collector 22. The collector source 46 drives the load directly and hence is an added contribution to the short circuit current of solar cell transistor 10. The collector photocurrent source 46 is many times larger than the additional photocurrent contribution (emitter photocurrent source 42 and base photocurrent source 44) at the front p+/n junction between the emitter 18 and base 20 junction from the reflected light if a perfect light-reflecting back exists. This is true because the light at the rear junction between the base 20 and collector 22 is not further attenuated as compared with the light reflected back to the front junction between the emitter 18 and base 20, which must travel back through the entire thickness of the main cell.

The collector photocurrent source 46 across the rear n/p+ junction of the base 20 and collector 22 provides a significant increase (as much as 20%) of the total short-circuit current or 6 mA/cm$^2$ for a fifty micron thick main cell. The collector perimeter diode 40 located at the p+/n+ junction of the collector 22 and the finger 24 is a nuisance giving rise to large dark current near the back surface where the dopant concentrations of the p+ collector layer 22 and the n+ finger 24 are very high. Large dark currents cause tunneling and an almost ohmiclike leakage current at a short circuit current of 30 mA/cm$^2$ or at open-circuit voltage levels of 700 mV. Although the area of the collector perimeter diode 40 which shunts across the rear n/p+ junction between the base 20 and collector 22 is very small compared with the rear n/p+ junction of the base 20 and collector 22, the high tunneling current density can still make the collector perimeter diode 40 detrimental to the very high efficiency performance of a floating emitter solar cell "transistor" 10. Therefore, to eliminate the collector perimeter diode 40 or to reduce the leakage current to an insignificant value compared with a short-circuit current of 30 mA/cm$^2$, the surface concentrations of the back p+ collector layer 22 and the diffused or ion-implanted n+ base contact finger 26 must be reduced.

Figure 3:
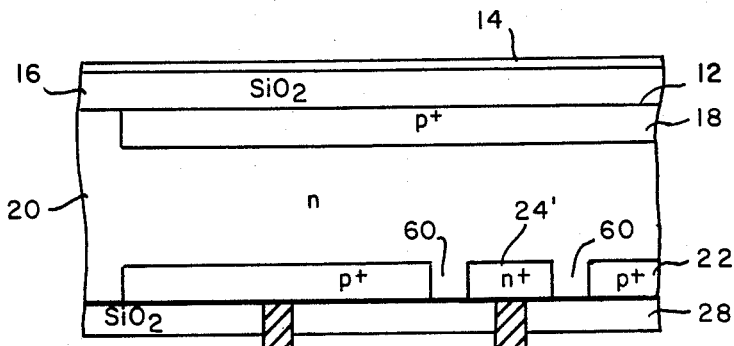

There are alternative configurations which permit the elimination of the p+/n+ collector perimeter diode 40 and the accompanying problems described above. FIG. 3 illustrates a structure similar to that disclosed in FIG. 1a except that FIG. 3 utilizes a diffusion mask which prevents the p+ and the n+ dopants from diffusing into spaces 60 around a section 24' doped n+ for making a connection of a base contact 30'. All other elements of the configuration of FIG. 3 are identified by the same reference numerals as in FIG. 1a for convenience in comparison. This eliminates the p+/n+ junction where a collector perimeter diode would otherwise form. Thus, the spaces 60 separating the p+ and n+ materials remain n-type material and so the collector perimeter diode is never formed. The relative sizes of the n+ doped section 24' and undoped spaces 60 shown in FIG. 3 are 2 microns, and 1 micron, with p+ doped sections for the collector about 200 microns. This alternative configuration is easily achieved with standard VLSI techniques of masked doping.

Figure 4A:
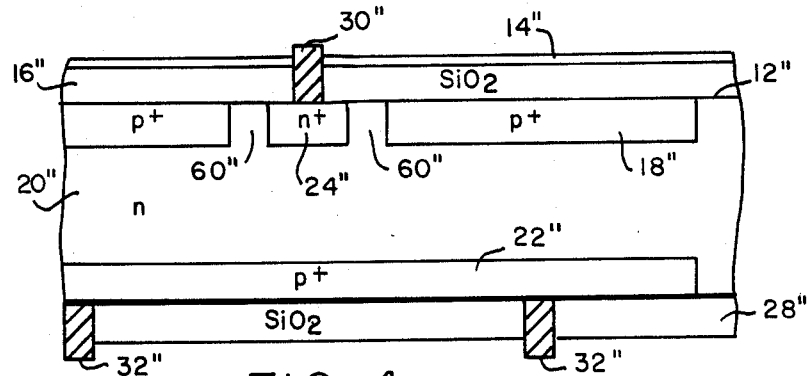
FIG. 4a shows schematically a cross section of a new and improved front surface contact, vertical floating emitter, solar cell "transistor"

FIG. 4a illustrates an embodiment of the floating emitter solar cell "transistor" which, in accordance with the present invention, incorporates the advantages of the prior art, and facilitates fabrication by providing a front contact 30" for the base. A section 24" doped n+ is provided by diffusion through the front surface with spaces 60" to separate the base contact from the floating emitter layer 18". The collector layer 22" is then diffused as a continuous layer, except it stops before the edge where a saw cut is to be made, with contact 32" through SiO₂ film 28".

Each element present in FIG. 4a that is common to a corresponding element of FIG. 3 is identified by the same numeral double primed. The structure is a front surface contact (FSC) vertical floating emitter (VFE) solar cell "transistor" (SCT), as opposed to a back surface contact (BSC) solar cell "transistor" disclosed in FIGS. 1 and 3. In employing the front surface contact structure, a certain percentage of the area of the illuminated front surface is shielded from radiation by the metal front surface contacts 30". However, since the shadow loss caused by the metal front surface contacts is at most approximately 5% of the total area of the illuminated surface. This loss is not serious.

The configuration of FIG. 4a has an advantage in fabricating the front surface contact 30" in that there is then more space for back surface 41 contacts, and in fact the base surface contact may then be a continuous sheet. However, there is still a requirement of oxide masking so that the back p+ diffusion at the collector layer 22" is removed from the mechanical sawed edges of the solar cell "transistor" to avoid saw damage which would short-circuit the rear n/p+ junction between the base 20" and collector 22". In addition, the front surface contact geometry shows that the forward alpha would be closer to unity than the reverse alpha since the front p+/n junction area beweem the emitter 18" and base 20" is somewhat smaller than the rear n/+ junction between the base 20" and emitter collector 22".

Figure 5:
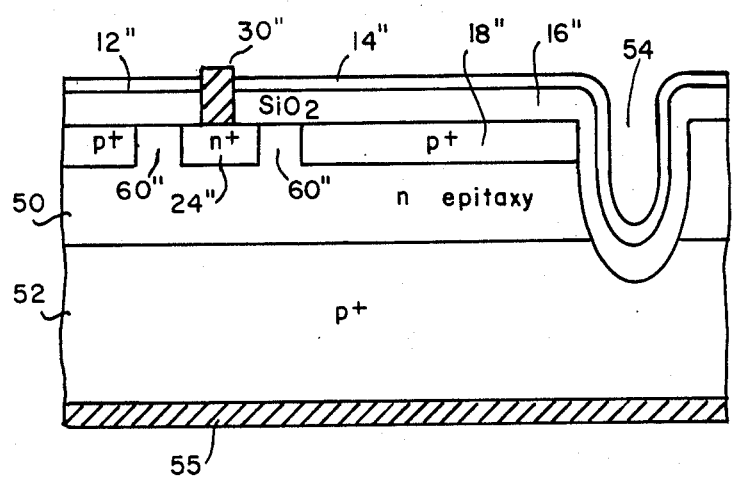

One distinct advantage offered by the front surface contact geometry is disclosed in FIG. 5 which illustrates an alternative embodiment of the front surface contact floating emitter solar cell transistor of FIG. 4a incorporating an epitaxial vertical dsign. The reference numeral for each element of the solar cell "transistor" common to an element of the solar cell "transistor" of FIG. 4a is the same, and others are identified by the next odd number in sequence. The advantage is the possibility of using an epitaxial base layer 50 grown on a thick (p+) collector substrate 52 so that the mechanical breakage problem for a four-to-six inch diameter solar cell "transistor" is avoided. This construction automatically limits the solar cell "transistor" to front surface contact geometry since it would be impossible to penetrate the thick (p+) collector substrate 52 to make contact with the thin epitaxial base layer 50 from the back surface. It is evident that a deep wafer edge groove 54 is necessary to isolate the rear n/p+ junction between the epitaxial base 50 and collector substrate 52 from the saw damage at the perimeter of the wafer on the right.

The thickness of the epitaxial base layer 50 does not have to be very large since a maximum efficiency can be obtained at about fifty micron thickness. Additional open-circuit voltage and efficiency gain is obtained by extending the back surface field into the fifty micron thick epitaxial base layer 50. The short-circuit current peaks at a penetration of about twenty microns leaving an epitaxial base layer 50 of thirty microns where the dopant concentration is a constant at $1.0 \times 10^{17}$ per cubic centimeter. However, penetrations as deep as 48 microns in the 50 micron film epitaxial layer 50 will still give a high efficiency approaching 20%.

The epitaxial front surface contact (FSC), vertical floating emitter (VFE) solar cell "transistor" (SCT) of FIG. 5 encompasses all the advantages of the configuration of FIG. 4a and does not require too many processing steps. In addition, all of the processing steps are well known and within the state-of-the-art of the current silicon VLSI technology. Using a relatively thin epitaxial base layer 50, such that the forward and reverse alphas are near unity, and minimizing all possible recombination losses, a high open-circuit voltage, a low short-circuit current loss and a high efficiency exceeding 20% can be achieved. Preliminary calculations based upon conservative values of lifetimes and surface recombination velocities have also indicated substantial open-circuit voltage gain as well as short-circuit current gain due to the presence of the rear n/p+ junction between the epitaxial layer 50 and the substrate 52. Design equations have also been derived to estimate the variation of the open-circuit voltage across the area of the solar cell transistor due to the anticipated spread of the current gain beta. Even for a beta variation of two-to-one, the open circuit variation is only about $$(k\ T/q)/\log_e 2 = 0.7(k\ T/q) \qquad (2)$$

or 20 mv, which is tolerable.

Figure 4B:
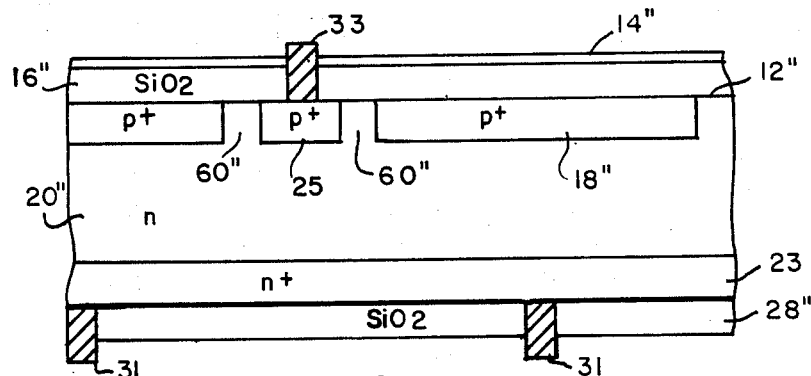
Figure 6:
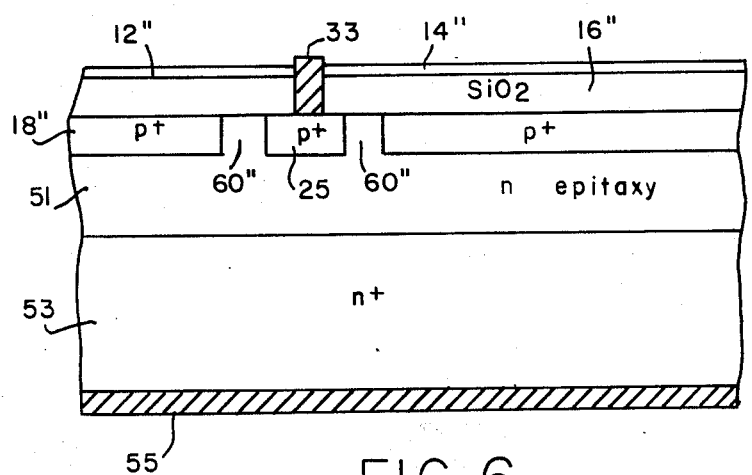
FIG. 6 shows schematically a cross section of a variant of the solar cell of FIG. 4b.

Lateral floating emitter solar cell "transistor" structures are illustrated in FIGS. 4b, and 6. For convenience, the corresponding elements of FIG. 4a and FIG. 5 are identified by the same reference numerals in FIG. 4b and FIG. 6, except where changes have occurred, in which case a new number is assigned next in sequence to the number shown in FIG. 4a.

Referring first to FIG. 4b, the solar cell "transistor" is similar to the vertical floating emitter transistor of FIG. 4a, except that a section 25 is diffused p+ for a collector contact 33 and a layer 23 is diffused in n+ for base contact 31, such that the emitter to collector channel is horizontal to the front surface rather than perpendicular. This FSC-LFE-SCT geometry has all of the fabrication and mechanical advantages of the FSC-VFE-SCT geometry of FIG. 4a. The lateral floating emitter (LFE) structure of FIG. 4b has all of the advantages of the vertical floating emitter (VFE) structure of FIG. 4a. The obvious disadvantage of the lateral LFE geometry is the assymetry of the transistor which would make the forward alpha close to unity, but the reverse alpha very small, unless there is negligible recombination in the base and at the interfaces and if the spacing of the p⁺ sections is small compared with the minority carrier diffusion length in the n-type base. The smallness of the reverse alpha would produce no increase of the open-circuit voltage, i.e., it will be equal to voltage across the front p⁺/n collector/base junction which results in a high current density, equal to 100-sun if the area ratio of the large floating emitter (p⁺) junction to the small collector contact (p⁺) junction is 100, since it can be assumed that there is little current loss across the back surface field (n/n⁺) junction.

Referring next to FIG. 6, the front surface contact (FSC) lateral floating emitter solar cell "transistor" (SCT) is similar to the vertical floating emitter transistor of FIG. 4b, except that its base layer 51 is epitaxially grown n-type on a substrate 53 (n+-type). For convenient reference, the same numerals are carried over from FIG. 4b. Emitter sections 18" and collector contact sections 25 are provided for each sollar cell "transistor" as for the geometry of FIG. 4b. Note that a continuous metal sheet 55 is deposited on the back as a base contact. With this geometry, and n+ substrate 53 may be thick so that mechanical breakage problems are avoided for large 4 to 6 inch diameter structures, as in the case of FIG. 5. The disadvantage of this lateral floating emitter solar cell "transistor" geometry is the same as for the geometry of FIG. 5. This advantage is that they are easier to fabricate since they require only one diffusion on the front surface and no masking on the back surface. Assuming the cell area is large so that the perimeter damage across the back surface field (n/n+) junction will not influence the open circuit voltage, the LFE structure of FIG. 6 has the advantage over the VFE structure of FIG. 5 in not requiring any wafer edge groove to isolate the damage from the solar cell "transistor".

Figure 7:
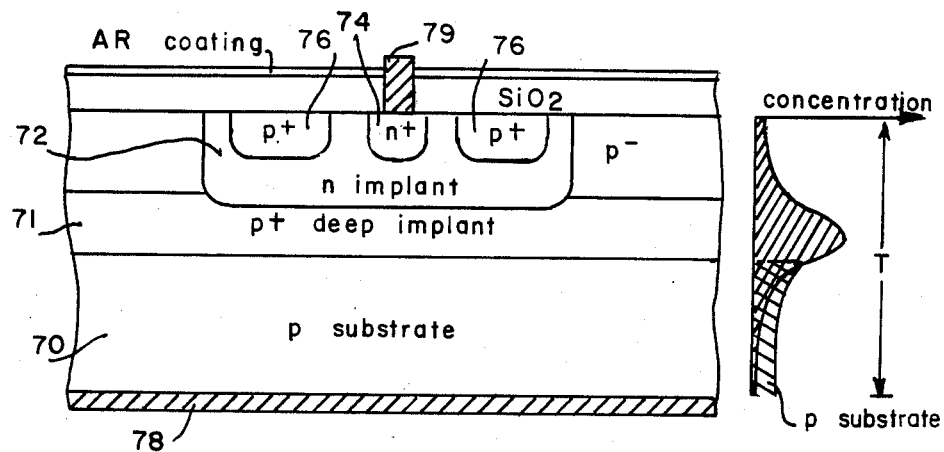
FIG. 7 shows schematically a cross section of a vertical floating emitter solar cell "transistor" fabricated with ion implantation techniques.

As noted hereinbefore, the present invention is not restricted to silicon; all embodiments illustrated can be implemented in any semiconductors in which p and n-type regions can be produced, such as by diffusion, implantation or epitaxy. FIG. 7 illustrates a vertical floating emitter solar cell "transistor" similar to that of FIG. 5 but produced in a p-type substrate 70 with a deep p+ layer 71 produced by ion implantation instead of epitaxy. The starting silicon thickness T may be made sufficiently thick to accommodate the solar cell transistor in an n-type well 72. To produce the solar cell "transistor", a p+ deep implant layer is first produced across the entire substrate, such as by implanting boron. Next n-type wells 72 are implanted to serve as the base section, followed by an n+-type 74 to serve as a base contact and p+-type 76 to serve as floating emitters. Oxide or nitride masks are employed for these additional ion implantation steps. To complete the structure, a collector metal contact 78 is made on the back, and a base metal contact 79 is made on the front. There are many advantages to this ion implantation structure, such as obviating the need for etching wafer edge grooves, but this structure may not be too easy to make since it requires very deep or very high energy p-type ions (several to tens MeV) to get a deep and thick implant layer 71.

Figure 8:
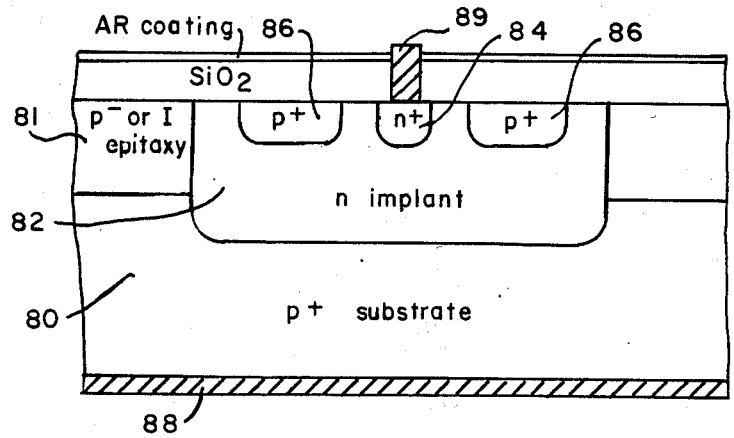
FIG. 8 shows schematically a cross section of a vertical floating emitter solar cell "transistor" fabricated by epitaxial growth of a layer on a substrate, ion implantation, and then diffusion of a well through the epitaxy layer followed by ion implantation of base and emitter sections.

A variant of the structure illustrated in FIG. 7 which avoids the need for such deep ion implantation is illustrated in FIG. 8. A p+ substrate 80 of sufficient thickness to provide the desired strength for the device serves as the starting material. A p− or intrinsic epitaxy layer 81 is then grown to a thickness sufficient to accommodate the solar cell "transistor". Next ions are implanted and then diffused to produce an n-type well 82 extending through the epitaxy layer 81 into the substrate 80. Within this well an n+ base contact section 84 is implanted between p+ floating emitter sections 86 implanted with p-type ions. A back contact 88 to the collector (well 82) and a front contact 89 to the base (n+ section 84) completes the structure. All of the advantages of the structure illustrated in FIG. 7 are retained without the disadvantage of requiring deep implantation. The depth of the implanted well 82 is increased by diffusion of the n-type implanted ions, leaving only shallow implants for the emitter and base sections. However, it will require a thick epitaxy layer 81, which is not very easily grown with the present epitaxy technology. The advantage of these two structures (FIGS. 7 and 8) over that of FIG. 5 is that they do not required a wafer edge groove.

In each of the foregoing structures, polysilicon may be added as a barrier layer in the metal contacts to further reduce recombination losses. However, this variation is not very important in the present invention where emitter contacts are not required, since recombination losses at the base are much less. Having no emitter contact is a major advantage of the floating emitter solar cell structure.

Although particular embodiments of the invention have been described and illustrated herein with reference to p-n-p floating emitter solar cell "transistor", the principles and structures also apply to n-p-n floating emitter solar cell "transistors" by simply interchanging n with p, n+ with p+ and p+ with n+ in doping the different sections or regions. It should also be recognized that the structures are not limited to silicon, but can be implemented in any semiconductor in which p, p+, n, and n+ regions or sections can be produced, either by diffusion, epitaxy or ion implantation. Still other modifications and variations may readily occur to those skilled in the art. Consequently, it is intended that the claims be interpreted to cover such modifications and equivalents.

What is claimed is:

1. A solar cell comprising a semiconductor body of one conductivity type having parallel front and back surfaces, a plurality of floating emitter sections of opposite conductivity type forming a p-n junction in said semiconductor body at the front thereof, front sections in said semiconductor body at the front surface thereof between adjacent ones of said floating emitter sections, said front sections being separated from said floating emitter sections, and a back surface layer, each of said front sections and said back surface layer being of opposite conductivity type to each other, one being of the same conductivity type as said floating emitter sections to function as a collector for said floating emitter sections and the other being of the same conductivity type as said semiconductor body to function as a contact section to said semiconductor body, said semiconductor body functioning as a common base for said floating emitter sections.

2. A solar cell as defined in claim 1 wherein each of said front sections in said semiconductor body between floating emitter sections is of a conductivity type opposite said floating emitter sections to function as a contact section to said semiconductor body serving as a common base to said floating emitter sections, and said back surface layer is of the same conductivity type as said floating emitter sections to function as a collector for said floating emitter sections.

3. A solar cell as defined in claim 2 wherein said semiconductor body is epitaxially grown on said back surface layer and doped opposite said back surface layer to form a p-n junction therebetween, and said back surface layer comprises a thick substrate, and including a groove etched through the semiconductor body from the front surface and into said back surface layer substrate to isolate the aforesaid p-n junctions from saw damage at the edge of said semiconductor body.

4. A solar cell as defined in claim 1 wherein each of said front sections diffused into said semiconductor body between floating emitter sections is of the same conductivity type as said floating emitter sections to function as a collector section for adjacent floating emitter sections, and said back surface layer is of a conductivity type opposite said floating emitter sections to function as a contact to said semiconductor body serving as a common base to said solar cell.

5. A solar cell as defined in claim 4 wherein said semiconductor body functioning as a common base is epitaxially grown on said back surface layer, and said back surface layer is a thick substrate.

6. A solar cell comprising a semiconductor substrate of one conductivity type; a layer of said semiconductor over said substrate heavily doped with impurities of said one conductivity type; a top layer of said semiconductor over said heavily doped layer, said top layer being either lightly doped with impurities of said one conductivity type or not doped; a well in said top layer extending down into said heavily doped layer, said well being doped with impurities of a conductivity type opposite said one conductivity type and comprising: (1) foating emitter sections heavily doped with impurities of said one conductivity type, said emitter sections being embedded in the front surface of said well (2) a base section heavily doped with impurities of said opposite conductivity type, said floating emitter sections and said base section being separated from each other and the walls of said well, (3) a metal contact formed on said base section; and a metal contact formed on the entire back surface of said substrate to serve as a collector contact for said floating emitter solar cell.

7. A solar cell comprising a semiconductor substrate of one conductivity type; a layer of said semiconductor over said substrate heavily doped with impurities of said one conductivity type; a top layer of said semiconductor over said heavily doped layer either lightly doped with impurities of said one conductivity type or not doped with any impurities; a well in said top layer doped with impurities of a conducitvity type opposite said one conductivity type, said well extending into said top layer to a depth sufficient for the well to form a junction with said heavily doped layer and comprising: (1) floating emitter sections heavily doped with impurities of said one conductivity type, (2) a base section heavily doped in said well with impurities of said opposite conductivity type, said floating emitter sections and said base section being separated from each other and from the walls of said well, (3) a metal contact formed on said base section; and a metal contact formed on the entire back side of said substrate to serve as a collector contact for said floating emitter solar cell.

8. A solar cell comprising a semiconductor substrate heavily doped with impurities of one conductivity type; a layer of said semoconductor over said substrate either lightly doped with impurities of said one conductivity type or not doped; a well doped with impurities of a conductivity type opposite said one conductivity type, said well extending down through said layer over said substrate and into said substrate to form a junction between said well and said substrate and comprising: (1) floating sections heavily doped with impurities of said one conductivity type, said emitter sections being embedded in the front surface of said well, (2) a base section heavily doped with impurities of said opposite conductivity type, said floating emitter sections and said base section being separated from each other and the walls of said well (3) a metal contact formed on said base section; and a metal contact formed on the entire back surface of said substrate to serve as a collector contact for said floating emitter solr cell.

9. A solar cell comprising a semiconductor substrate heavily doped with impurities of one conductivity type; a layer of said semiconductor over said substrate either lightly doped with impurities of said one conductivity type or not doped; a well doped with impurities of a conductivity type opposite said one conductivity type, said cell extending into said layer over said substrate to a depth sufficient to form a junction with said substrate and comprising: (1) floating emitter sections heavily doped with impurities of said one conductivity type, (2) a base section heavily doped in said well with impurities of said opposite conductivity type, said floating emitter sections and said base section being separated from each other and from the walls of said well, (3) a metal contact formed on said base section; and a metal contact formed on the entire back side of said substrate to serve as a collector contact for said floating emitter solar cell.

* * * * *